United States Patent [19]

Kizilyalli

[11] Patent Number: 5,710,055

[45] Date of Patent: Jan. 20, 1998

[54] METHOD OF MAKING PMOSFETS HAVING INDIUM OR GALLIUM DOPED BURIED CHANNELS AND N+ POLYSILICON GATES AND CMOS DEVICES FABRICATED THEREFROM

[75] Inventor: Isik C. Kizilyalli, Orlando, Fla.

[73] Assignee: Lucent Technologies Inc., Murray Hill, N.J.

[21] Appl. No.: 478,133

[22] Filed: Jun. 7, 1995

Related U.S. Application Data

[62] Division of Ser. No. 347,980, Dec. 1, 1994, abandoned.

[51] Int. Cl.[6] ................................................. H01L 21/265
[52] U.S. Cl. .................................................... 437/45; 437/41
[58] Field of Search .......................... 437/45, 20, 41 CS

[56] References Cited

U.S. PATENT DOCUMENTS

| | | | |
|---|---|---|---|
| 4,199,773 | 4/1980 | Goodman et al. | 437/84 |
| 4,574,467 | 3/1986 | Halfacre et al. | 437/45 |
| 4,679,303 | 7/1987 | Chen et al. | 437/20 |
| 4,845,047 | 7/1989 | Holloway et al. | 437/45 |
| 4,931,407 | 6/1990 | Maeda et al. | 437/45 |
| 4,975,757 | 12/1990 | Egawa et al. . | |
| 5,030,584 | 7/1991 | Nakata | 437/44 |
| 5,114,874 | 5/1992 | Custode . | |
| 5,134,448 | 7/1992 | Johnsen et al. . | |
| 5,153,146 | 10/1992 | Toyoshima et al. | 437/45 |
| 5,244,823 | 9/1993 | Adan . | |
| 5,256,583 | 10/1993 | Hollinger . | |
| 5,266,508 | 11/1993 | Azuma et al. | 437/45 |
| 5,266,510 | 11/1993 | Lee | 437/45 |
| 5,270,257 | 12/1993 | Shin . | |
| 5,320,974 | 6/1994 | Hori et al. | 437/45 |
| 5,328,864 | 7/1994 | Yoshizumi et al. . | |
| 5,330,925 | 7/1994 | Lee et al. . | |
| 5,346,587 | 9/1994 | Doan et al. | 437/192 |
| 5,401,994 | 3/1995 | Adan | 257/335 |

OTHER PUBLICATIONS

Shahidi et al., Indium Channel Implant for ImprovedShort-Channel Behavior of Submicrometer NMOSFET's, IEEE ElectronDevice Letters, vol. 14, No. 8, Aug. 8, 1993.

G.G. Shahidi et al., "Indium Channel Implant for Improved Short-Channel Behavior of Submicrometer NMOSFET's", IEEE Electron Device Letters, vol. 14, No. 8, Aug. 1993.

T. Ohguro et al., "Tenth Micron P-MOSFET's With Ultra-Thin Epitaxial Channel Layer Grown by Ultra-High-Vacuum CVD", IEDM Technical Digest, pp. 433-436, 1993.

D. Roddy, *Introduction To Microelectronics* Second Edition, Pergamon Press, pp.100-102, 1978.

Wolf et al., *Silicon Processing For The VLSI ERA*, Lattice Press, pp. 308-311, 1986.

Richard C. Dorf, ed., *The Electrical Engineering Handbook*, CRC Press, pp.581-584; pp. 1631-1635, 1993.

S.M. Sze, *VLSI Technology* Second Edition, McGraw-Hill, Inc., pp. 272-326, 1988, 1983.

S.M. Sze, *VLSI Technology* Second Edition, McGraw-Hill, Inc., pp. 327-374, 1988, 1983.

Hillenius et al., "A symmetric Submicron CMOS Technology", IEDM Technical Digest, pp. 252-255, 1986.

*Primary Examiner*—Brian Dutton

[57] ABSTRACT

Sub-micron PMOSFETs including $n^+$ polysilicon gates and buried channels having impurity concentrations comprising indium or gallium are provided. The buried channel PMOSFETs have improved short channel characteristics and are particularly suitable for use in CMOS technologies.

9 Claims, 5 Drawing Sheets

METHOD OF MAKING PMOSFETS HAVING INDIUM OR GALLIUM DOPED BURIED CHANNELS AND N+ POLYSILICON GATES AND CMOS DEVICES FABRICATED THEREFROM

This is a divisional of application Ser. No. 08/347,980 filed Dec. 1, 1994, now abandoned.

BACKGROUND OF THE INVENTION

1. Field of the Invention

The present invention relates generally to semiconductor devices. Specifically, the invention relates to a novel indium or gallium doped buried p-channel metal oxide semiconductor field effect transistor (PMOSFET) having an $n^+$ polysilicon gate. The PMOSFETs described herein exhibit improved short channel characteristics and are particularly suitable for use in complementary metal oxide semiconductor (CMOS) technologies.

2. Description of the Related Art

Methods for making MOSFETs are well known in the art. MOSFETS having effective short channel lengths of 1 micron or less are particularly desirable for use in very large scale integrated circuits (VLSI) or ultra large scale integrated circuits (ULSI). Improvements in the density of FET integrated circuits are achieved by scaling down the device dimensions. Conventional MOSFETs having effective channel lengths of 1.0 μm or less exhibit short channel effects such as greater $V_{th}$ roll-off, subthreshold leakage and channel punch-through which are detrimental to the performance of scaled down devices.

The characteristics of semiconductor materials are modified by doping the materials with impurity ions. Conventional dopants such as, for example, boron, phosphorus, arsenic and antimony ions can be employed to control the resistivity of the layers of the MOSFET. The channels of PMOSFETs are typically doped with boron or boron compounds such as $BF_2$. See, for example, T. Ohguro et at. *Tenth Micron PMOSFETs with Ultra-Thin Epoitaxial Channel Layer Grown by Ultra-High Vacuum CVD*, IEDM Technical Digest, pp. 433–436 (1993). However, p-channels doped with boron or boron compounds exhibit undesirable diffusion and penetration into the substrate of the PMOS device.

Indium ions exhibit sharper implanted doping profiles compared to the implanted doping profiles obtained with boron ions. Indium impurity ions have been implanted in submicrometer NMOSFETs to obtain nonuniform channel doping. See, G. G. Shahidi et at., *Indium Channel Implant for Improved Short-Channel Behavior of Submicrometer NMOSFET's*, IEEE Electron Device Letters, Vol. 14, No. 8, pp. 409–411 (1993).

$P^+$ polysilicon gates have been employed with sub-0.5 μm PMOS buried channel transistors to reduce some short channel effects. See, for example, S. J. Hillenius et al, "*A Symmetric Submicron CMOS Technology*" IEDM Technical Digest, pp. 252–255 (1986). However, when PMOSFETS having $p^+$ polysilicon gates are employed in CMOS technologies two polysilicon gate processes are required, namely, $n^+$ polysilicon gates for the NMOSFETs and $p^+$ polysilicon gates for the PMOSFETs of the CMOS devices. The presence of both $n^+$ and $p^+$ polysilicon gate processes in CMOS technologies complicates the process flow and increases costs. Furthermore, $p^+$ polysilicon gates are commonly doped with boron which has an undesirable tendency to penetrate the gate oxide and substrate of the transistor. In addition, the lowest attainable sheet resistance of $p^+$ polysilicon is a factor of 2 to 3 times greater than that of $n^+$ polysilicon.

PMOSFETs having $n^+$ polysilicon gates and buried channels doped with impurity ions which exhibit sharper implanted doping profiles and less diffusion of dopant ions in the substrate are desirable for obtaining semiconductor devices with narrower channels and improved short channel characteristics.

SUMMARY OF THE INVENTION

Indium or gallium doped buried channel PMOS field effect transistors having $n^+$ polysilicon gates are provided. A method is provided for making PMOSFETs having narrow buried channels and effective channel lengths of about 0.5 μm or less. The narrower buried channel PMOSFETs described herein exhibit improved short channel characteristics including minimal $V_{th}$ roll-off, reduced channel punch-through, and reduced subthreshold leakage. CMOS devices including the buried channel PMOSFETs described herein are also provided.

DETAILED DESCRIPTION OF PREFERRED EMBODIMENTS

The PMOSFETs described herein have $n^+$ polysilicon gates and buried channels including indium or gallium impurity ions. Since indium and gallium have higher atomic numbers than boron, the buried channels obtained in accordance with the present invention have sharper implanted doping profiles than buried channels doped with boron. Furthermore, indium and gallium have lower diffusion constants in silicon compared to boron and boron compounds, such as, $BF_2$. The sharper implanted doping profiles and lower diffusitivity of indium or gallium dopants in the buried channels of the PMOSFETs described herein result in the formation of narrow buried channels, i.e., buried channels having decreased buried channel depth wherein channel depth is measured from the interface of the substrate and the gate oxide layer. The present invention can provide buried channel PMOSFETs that are about 500 angstroms narrower than channels doped with boron.

Significant improvement in minimum length ($L_{min}$) of the channel is obtained when buried channel depth is reduced. To avoid adverse short channel effects the gate length should be longer than a gate length $L_{min}$. The indium or gallium doped buried channel PMOSFETs of the present invention are particularly useful for making sub-0.5 μm PMOS transistors having improved short channel characteristics.

Figure 1:
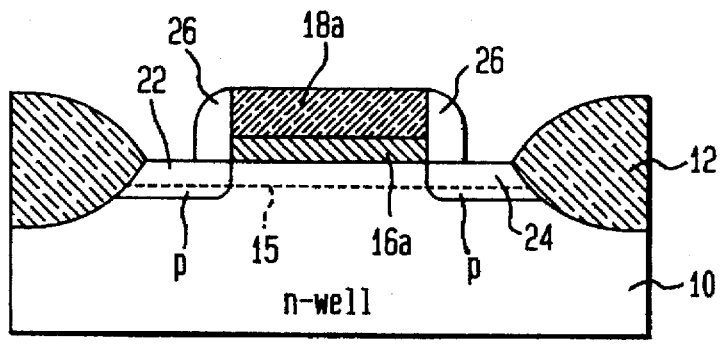
FIG. 1 is a side view in cross-section of a buried channel PMOSFET device in accordance with the present invention.

FIG. 1 is a side view in cross section of a preferred embodiment of a buried channel PMOSFET in accordance with the present invention. The PMOSFET includes a substrate 10, field oxide layer 12, buried channel region 15, gate oxide 16a, n⁺polysilicon gate electrode 18a, source region 22, drain region 24 and spacer insulator layers 26.

Figure 2:
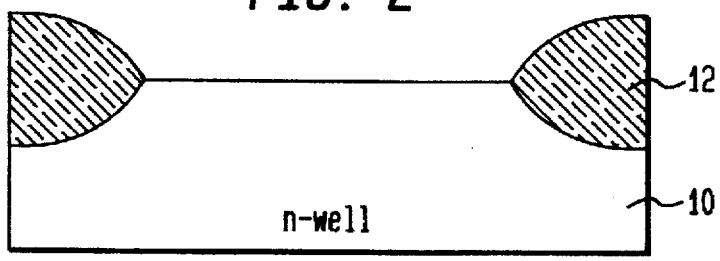
FIGS. 2–7 are side views in cross-section depicting intermediate structures provided at various stages of fabrication of a buried channel PMOSFET in accordance with the present invention.

FIGS. 2–6 are side views in cross-section depicting intermediate structures provided at various stages of fabrication of a buried channel PMOSFET in accordance with one embodiment of the present invention. With reference to FIG. 2, a substrate 10 is provided as a starting material for fabricating the buried channel PMOSFET. The substrate 10 comprises a semiconductor material, such as, for example, silicon, germanium, or arsenic. Substrate 10 is preferably an n-type or n-well silicon wafer implanted with phosphorus and/or arsenic ions at an impurity concentration of from about $1\times10^{16}$ to about $1\times10^{19}$ carriers per cubic centimeter. The substrate 10 preferably has a <100> orientation and a resistivity of from about $10^{-3}$ to about 10 ohm-centimeters. In one embodiment, the n-well can include a punch-through suppression implant, e.g., a $1.5\times10^{13}$ cm$^{-2}$ dose of arsenic ions. In addition, the substrate 10 preferably includes a field oxide layer 12 adjacent to a principal surface of the substrate to insulate the MOSFET from other structures adjacent to the MOSFET. A field oxide layer comprising silicon dioxide is preferred.

Figure 3:
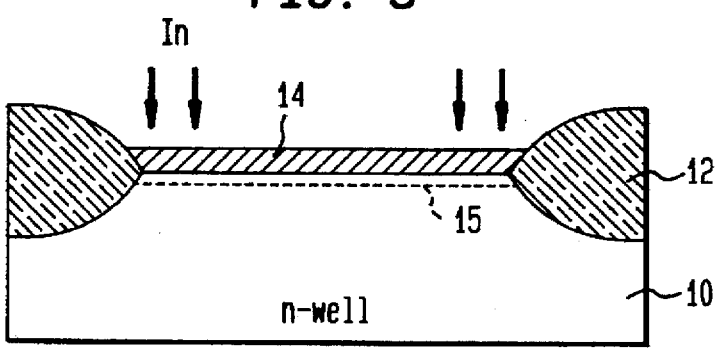

A screen layer 14 can be formed by conventional oxidation processing on the principal surface of the silicon substrate 10 to protect the surface of the substrate from contamination during ion implantation, as shown in FIG. 3. The screen layer 14 preferably comprises silicon dioxide having a thickness of from about 50 angstroms to about 200 angstroms. With reference to FIG. 3, indium or gallium ions are then introduced through screen layer 14 into substrate 10. The presence of a screen layer during the doping step is preferred; however, the ions can be implanted into a substrate which does not include a screen layer. The indium or gallium dopants are implanted into substrate 10 to a depth indicated by the dashed line in FIG. 3 to form a buried channel region 15. Alternatively, mixtures of indium and gallium ions can be implanted in substrate 10 to obtain the buried channel PMOSFETs described herein. In another aspect of the present invention, PMOSFETs having buried channels including indium ions and at least one other dopant, or gallium ions and at least one other dopant can be obtained. Indium ions are the most preferred dopants for achieving narrow buried channels in accordance with the present invention.

Any doping method may be employed to implant indium or gallium ions into the buried channel regions. Conventional doping methods are well known in the art. For example, diffusion or ion implantation can be employed for implanting the indium or gallium impurity ions into the channel regions. Doping methods are described in *VLSI Technology*, S. M. Sze, McGraw Hill Book Company, Chapters 7 and 8, pp. 272–374 (1988) and *Silicon Processing for the VLSI Era Volume 1: Process Technology*, S. Wolf and R. N. Tauber, Lattice Press, pp. 308–311 (1986) which are incorporated herein by reference. Ion implantation is a preferred method for introducing the dopants into the buried channels of the PMOS devices. The dose of the implant is preferably from about $1\times10^{11}$ cm$^{-2}$ to $1\times10^{14}$ cm$^{-2}$ and the energy of the implant is preferably less than about 100 keV. Narrower buried channels, i.e., buried channels having decreased buried channel depth can be obtained by reducing the energy of the implant. An implantation energy of from about 30 keV to about 50, keV is most preferred for obtaining narrow buried channels in accordance with the present invention. The concentration of the implant is preferably from about $1\times10^{16}$ to about $1\times10^{19}$ carriers per cubic centimeter. Rapid thermal annealing in an inert atmosphere may be performed following impurity ion implantation to remove damage to the substrate 10 caused by the ion implantation.

Figure 4:
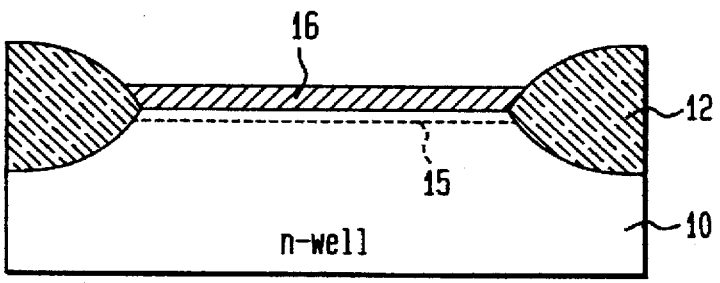

The screen layer 14 is removed, e.g. by etching, and an insulating film, such as, for example, a gate insulating layer 16 is then grown onto the principal surface of substrate 10, as shown in FIG. 4. A thermal oxidation technique can be employed to grow gate insulating layer 16 onto substrate 10 at a temperature of from about 800° C. to about 1200° C. to achieve a gate oxide having a thickness of from about 35 angstroms to about 200 angstroms. A gate insulating layer thickness of about 50 angstroms to about 150 angstroms is preferred, and a gate insulating layer thickness of about 65 angstroms is most preferred. The indium or gallium dopants implanted in the buried channel PMOSFETs of the present invention exhibit less diffusitivity during this thermal oxidation step than conventional dopants such as boron ions. Reduced diffusion of dopant species is particularly advantageous for obtaining sub-0.5 micrometer transistors having improved short channel characteristics.

Figure 5:
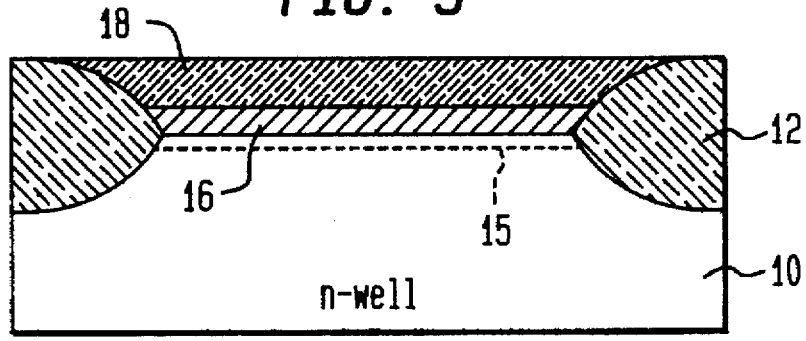

A heavily doped n type (n⁺) polysilicon layer 18 is deposited on gate oxide layer 16, as shown in FIG. 5. The n⁺ polysilicon layer can be formed, for example by diffusion or implantation of phosphorus or arsenic on a polysilicon layer to establish the polysilicon layer as n⁺ type polysilicon. The n⁺ polysilicon gate preferably includes impurity ions such as phosphorus, arsenic or antimony at a concentration of from about $10^{19}$ to about $10^{21}$ carriers per cubic centimeter.

Figure 6:
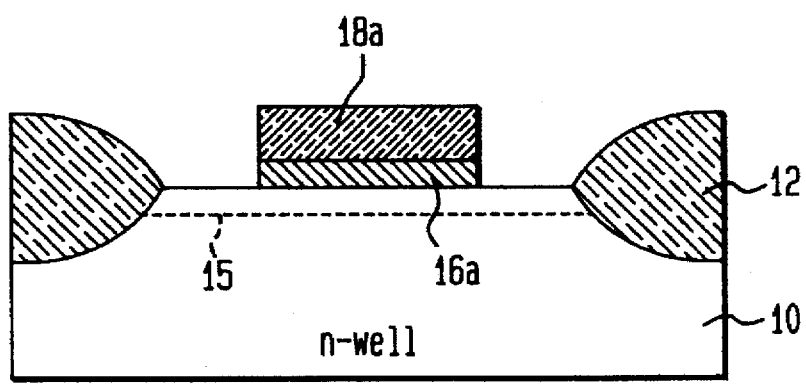
Figure 7:
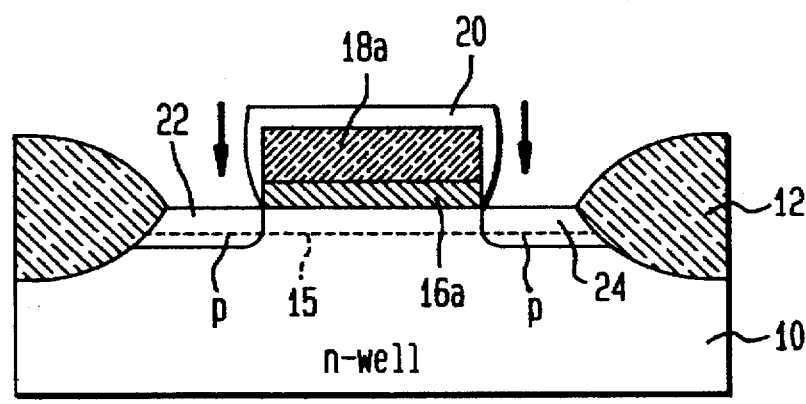

With reference to FIG. 6, the polysilicon gate electrode 18a of the buried channel PMOS transistor is defined by patterning and etching the n⁺ polysilicon gate layer using standard photolithographic techniques to achieve a gate length of about less than 1 micron. The effective buried channel length ($L_{eff}$) of a PMOSFET is determined by the length of the polysilicon gate. Thus, a gate length of less than about 0.5 microns is most preferred. The gate oxide layer 16a is preferably defined when the gate electrode 18a is patterned and etched from the polysilicon layer 18. Alternatively, the gate oxide layer 16a can be defined prior to patterning and etching gate electrode 18a.

A mask 20 is preferably deposited on the gate electrode prior to implanting ions in substrate 10 to form source 22 and drain 24 regions. The source 22 and drain 24 regions can be doped with boron ions or BF₂. Alternatively, the source and drain regions can be doped with indium or gallium ions.

Spacer insulator layers 26 can then be formed on the sides of gate electrode 18a. Furthermore, any known metallization scheme can be employed to form PMOSFET source, drain, and gate contacts.

Figure 8:
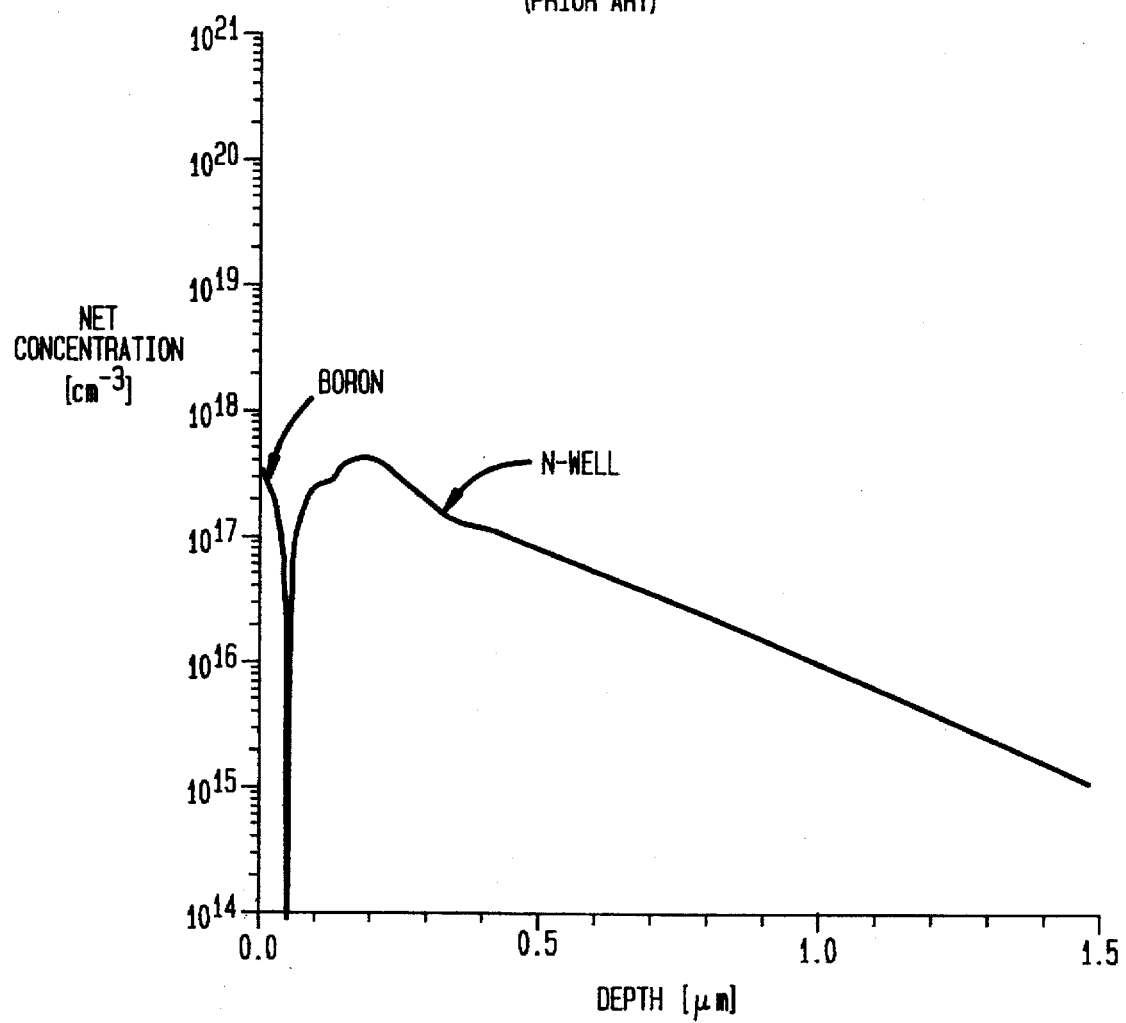
FIG. 8 is graphic illustration of ion implantation profiles of boron ions in the buried channel, and phosphorus and arsenic ions in the n-well of a conventional PMOSFET.
Figure 9:
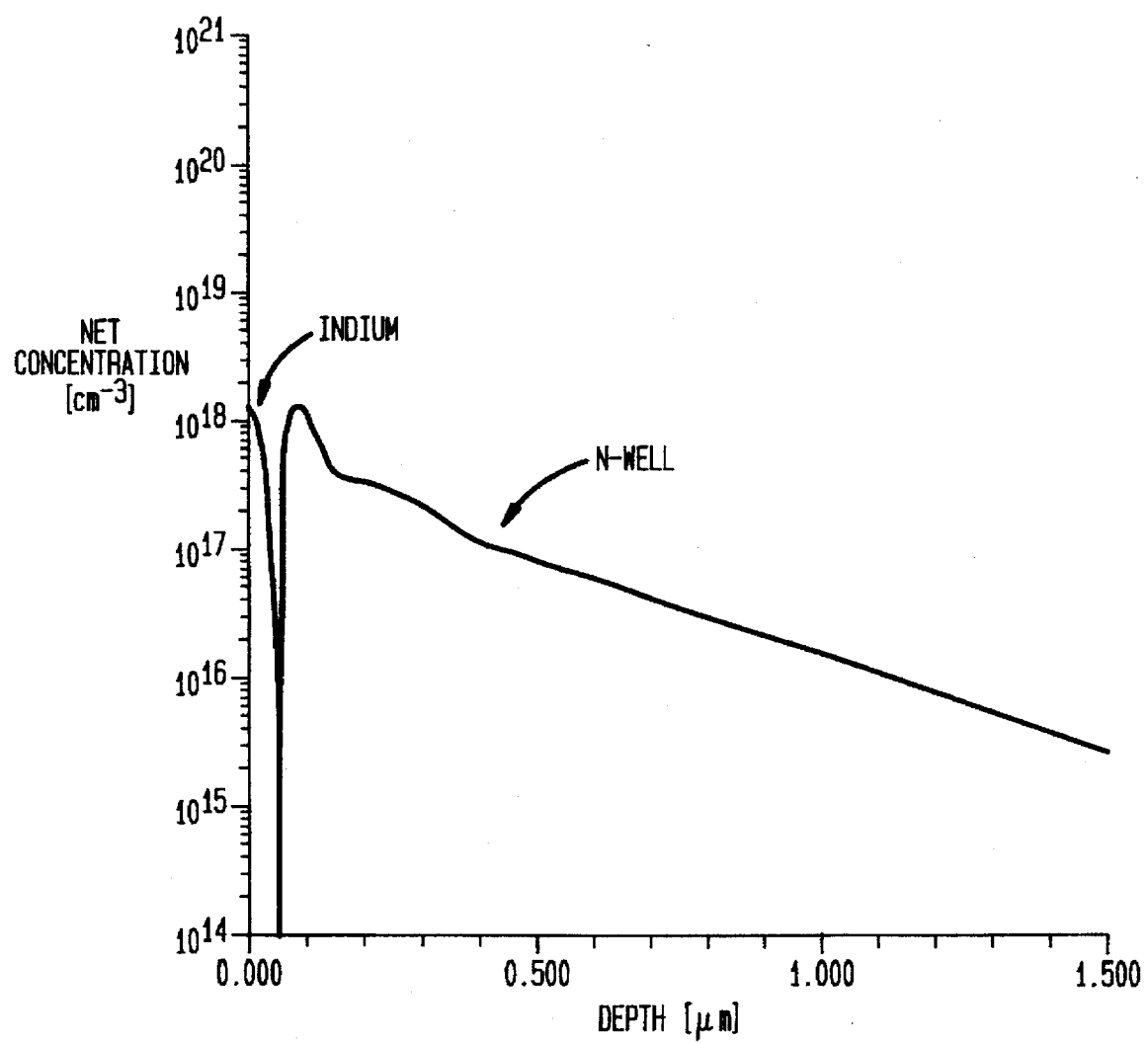
FIG. 9 is a graphic illustration of ion implantation profiles of indium ions in the buried channel, and phosphorus and arsenic ions in the n-well of a PMOSFET in accordance with the present invention.

FIG. 8 is a graphic illustration of a computer simulated ion implantation profile of a buried channel 0.5 μm PMOSFET having an n⁺ polysilicon gate and a buried channel doped with boron. FIG. 9 is a graphic illustration of a computer simulated ion implantation profile of a buried channel 0.5 μm PMOSFET having an n⁺ polysilicon gate and a buried channel doped with indium ions in accordance with the present invention. The dose of the indium ion channel implant was $1.4\times10^{13}$ cm$^{-2}$ at 60 keV through a 200 angstrom screen oxide. The indium ions provided a sharper implantation profile and less diffusitivity in the substrate compared to the boron implantation profile. In addition, a higher concentration of n-type ions was achieved in the substrate n-well of the PMOSFET having an indium doped buried channel. An increased concentration of n-type ions in the n-well is preferred for reducing channel punch-through. The buried channel depth of the PMOSFET doped with indium ions was about 0.03 μm whereas a buried channel depth of about 0.05 μm was obtained with boron channel doping. Thus, a narrower buried channel was obtained with indium channel doping.

Figure 10:
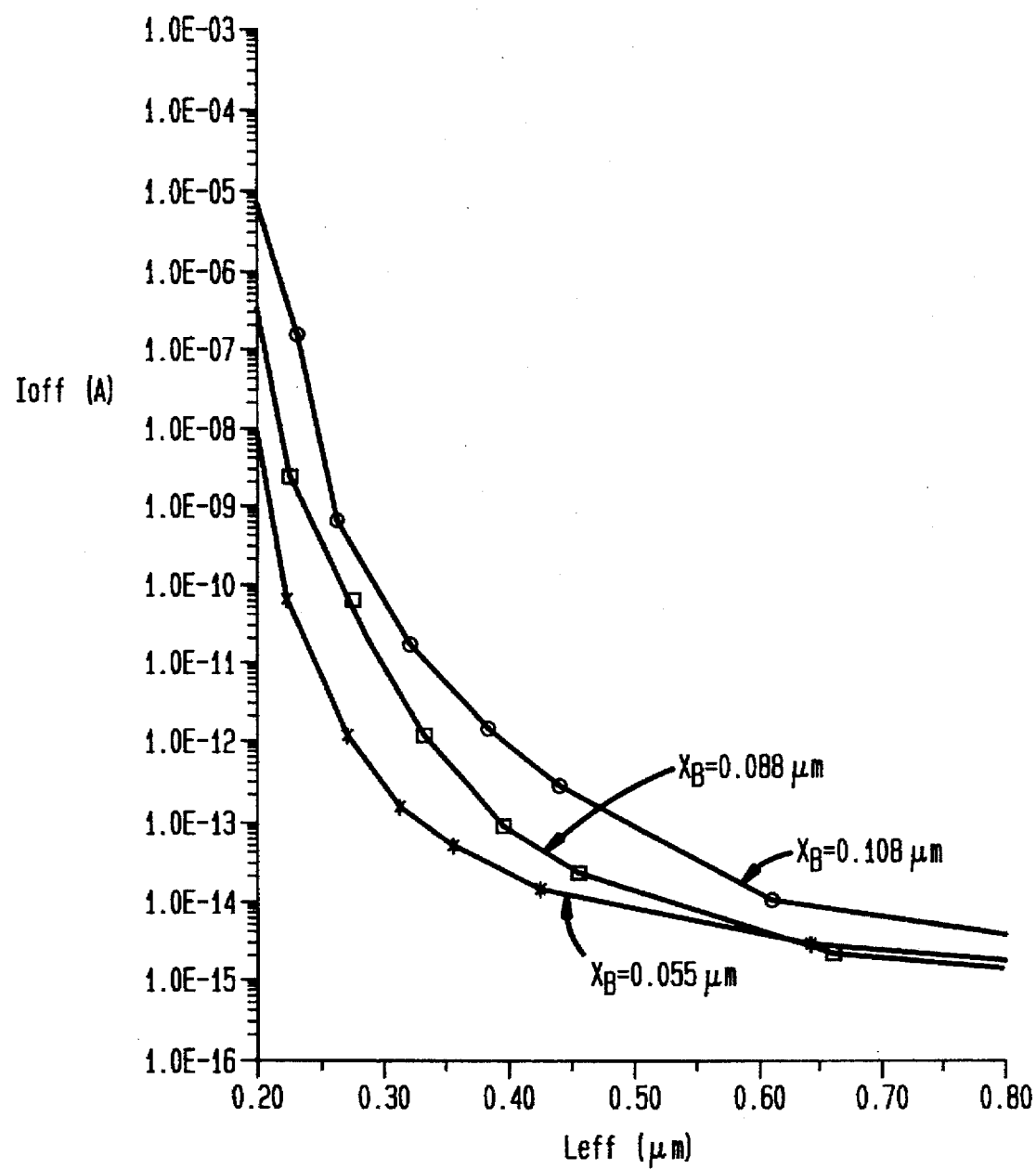
FIG. 10 is a graphic illustration of subthreshold leakage current ($I_{off}$) as a function of effective channel length at constant threshold voltage for three buried channel PMOSFETs having varying buried channel depth.

FIG. 10 is a graphic illustration of subthreshold leakage as a function of effective channel length at a constant threshold voltage of 0.78 V for three buried channel PMOSFETs having varied buried channel depth ($X_B$) obtained in accordance with the present invention. The three PMOSFETs had buried channel depths of 0.055 μm, 0.088 μm and 0.108 μm. Significant improvement in minimum effective channel length was obtained when buried channel depth was reduced. The narrow buried channels of the indium doped buried channel PMOSFETs described herein provide PMOSFETs having improved short channel characteristics such as minimal $V_{th}$ roll-off, reduced channel punch-through and reduced subthreshold leakage.

CMOS devices including the PMOSFETs of the present invention can be fabricated by methods well known in the art. See, e.g., D. Roddy, *Introduction to Microelectronics* Pergamon Press, pp. 100–102 (1978) and *The Electrical Engineering Handbook*, edited by Richard C. Dorf, CRC Press, Inc., pp. 581–584 and 1631–1635 (1993) which are incorporated herein by reference. The PMOSFETs described herein are particularly suitable for use in low voltage 0.1 μm to 0.35 μm CMOS technologies.

The PMOSFETs depicted in FIGS. 1–10 are not intended to limit the device described herein to any particular embodiment. Modifications and variations of the present invention are possible in light of the above teachings. For example, one skilled in the art can employ various techniques for ion implantation, deposition of semiconductor device layers (e.g., by physical vapor deposition or chemical vapor deposition), lithography and pattern transfer to make the PMOSFETs described herein. Furthermore, one can implant indium or gallium ions in the buried channels of the PMOSFETs in accordance with the present invention as well a combination of indium and gallium ions. In addition, the buried channels of the PMOSFETs described herein can be doped with indium and at least one other dopant or gallium and at least one other dopant. For example, a buried channel of a PMOSFET in accordance with the present invention can include indium ions and boron ions. It is therefore to be understood that changes may be made in particular embodiments of the invention described which are within the full intended scope of the invention as defined by the claims.

What is claimed is:

1. A process for making a PMOSFET device comprising the steps of:

a) providing a n-type substrate having a principal surface;

b) forming a channel region having a first end and a second end by implanting indium impurity ions into said principal surface of said substrate;

c) forming a gate oxide layer on the principal surface of said substrate;

d) forming a n⁺ type polysilicon layer on said gate oxide layer;

e) patterning and etching said polysilicon layer to form at least one n⁺ type polysilicon gate electrode on said gate oxide layer; and f) forming a source region adjacent said first end of said channel region and a drain region adjacent said second end of said channel region by introducing impurity ions into said principal surface of said substrate.

2. The process for making a PMOSFET device according to claim 1, further comprising forming at least one insulator layer on said polysilicon gate electrode.

3. The process for making a PMOSFET device according to claim 1, further comprising forming contact layers on said source region, said drain region and said gate electrode.

4. The process according to claim 1, wherein the step of providing a substrate comprises providing said substrate having a field oxide layer.

5. A process according to claim 1, wherein said step of providing a substrate includes applying a screen layer having a thickness of from about less than 200 angstroms to said substrate.

6. The process according to claim 1, wherein said step of forming said channel region by implanting indium impurity ions comprises implanting said impurity ions at a dose of from about $1 \times 10^{11}$ cm$^{-2}$ to about $1 \times 10^{14}$ cm$^{-2}$ at an implantation energy of about less than 100 keV.

7. The process according to claim 1, wherein said step of forming said channel region by implanting indium impurity ions comprises implanting said impurity ions at a dose of about $1.4 \times 10^{13}$ cm$^{-2}$ at an implantation energy of about 30 keV.

8. The process according to claim 1, wherein said step of forming said channel region comprises forming said channel region having a depth from said principal surface less than about 0.05 μm.

9. The process according to claim 8, wherein said step of forming said channel region comprises forming said channel region having a depth from said principal surface of about 0.03 μm.

* * * * *